United States Patent
Cho et al.

(10) Patent No.: US 9,935,189 B2
(45) Date of Patent: Apr. 3, 2018

(54) TRANSISTOR HAVING GERMANIUM CHANNEL ON SILICON NANOWIRE AND FABRICATION METHOD THEREOF

(71) Applicant: Gachon University of Industry-Academic cooperation Foundation, Seongnam-si, Gyeonggi-do (KR)

(72) Inventors: Seongjae Cho, Seoul (KR); Mina Yun, Gwangju-si (KR)

(73) Assignee: GACHON UNIVERSITY OF INDUSTRY—ACADEMIC COOPERATION FOUNDATION (KR)

( * ) Notice: Subject to any disclaimer, the term of this patent is extended or adjusted under 35 U.S.C. 154(b) by 0 days.

(21) Appl. No.: 15/345,781

(22) Filed: Nov. 8, 2016

(65) Prior Publication Data

US 2017/0133495 A1 May 11, 2017

(30) Foreign Application Priority Data

Nov. 9, 2015 (KR) .......................... 10-2015-0156652

(51) Int. Cl.
*H01L 29/06* (2006.01)
*H01L 29/775* (2006.01)
(Continued)

(52) U.S. Cl.
CPC ...... *H01L 29/775* (2013.01); *H01L 21/02236* (2013.01); *H01L 21/26513* (2013.01); *H01L 29/068* (2013.01); *H01L 29/0673* (2013.01); *H01L 29/1054* (2013.01); *H01L 29/161* (2013.01); *H01L 29/42392* (2013.01); *H01L 29/66439* (2013.01); *H01L 29/66742* (2013.01); *H01L 29/78618* (2013.01);
(Continued)

(58) Field of Classification Search
CPC ............ H01L 27/11565; H01L 29/267; H01L 29/1054; H01L 29/2003; H01L 29/66439; H01L 29/775; H01L 21/02532; H01L 21/26586; H01L 21/28264; H01L 27/11568; H01L 27/11578; H01L 27/11582; H01L 27/2472
See application file for complete search history.

(56) References Cited

U.S. PATENT DOCUMENTS

| 2009/0250689 A1* | 10/2009 | Colli | B82Y 10/00 257/39 |
| 2012/0305893 A1* | 12/2012 | Colinge | B82Y 10/00 257/29 |
| 2013/0228833 A1* | 9/2013 | Xiao | B82Y 10/00 257/288 |

FOREIGN PATENT DOCUMENTS

| KR | 10-0585111 | 5/2006 |
| KR | 10-1515071 | 4/2015 |

* cited by examiner

*Primary Examiner* — Robert Bachner
(74) *Attorney, Agent, or Firm* — Gerald E. Hespos; Michael J. Porco; Matthew T. Hespos

(57) ABSTRACT

The present invention provides a transistor and a fabrication method thereof. By a silicon nanowire as a core region being serially wrapped by a germanium channel, a gate insulating film and a gate, the present invention enables to form a potential well for storing holes as a carrier of HHMT in the germanium channel by a valance band energy offset between the silicon core region and the germanium channel, to gain maximum gate controllability to the germanium channel, and to simplify a fabricating process by simultaneously forming the germanium channel and the gate insulating film in one process.

8 Claims, 8 Drawing Sheets

(51) Int. Cl.
*H01L 21/02* (2006.01)
*H01L 21/265* (2006.01)
*H01L 29/423* (2006.01)
*H01L 29/66* (2006.01)
*H01L 29/786* (2006.01)
*H01L 29/10* (2006.01)
*H01L 29/161* (2006.01)

(52) U.S. Cl.
CPC .. *H01L 29/78687* (2013.01); *H01L 29/78696* (2013.01); *H01L 21/02532* (2013.01); *H01L 21/02603* (2013.01); *H01L 2029/42388* (2013.01)

FIG. (7A)
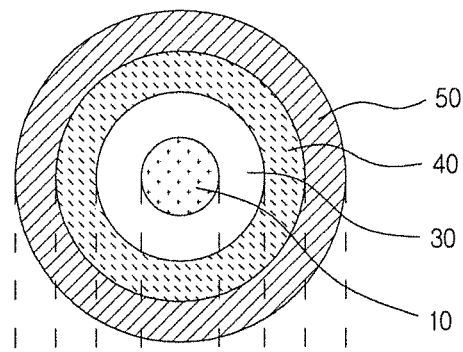
FIG. 7(B)
FIG. (7C)
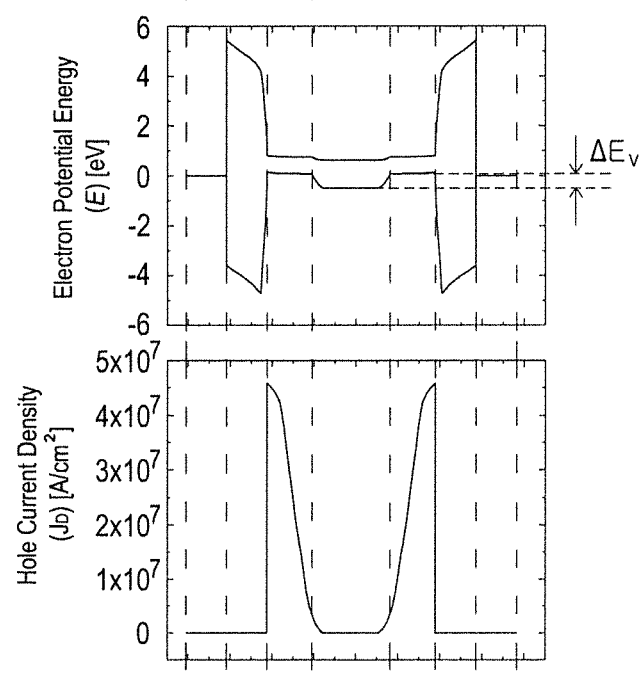

TRANSISTOR HAVING GERMANIUM CHANNEL ON SILICON NANOWIRE AND FABRICATION METHOD THEREOF

CROSS-REFERENCE TO RELATED APPLICATION

This application claims priority to Korean Patent Application No. 10-2015-0156652, filed on Nov. 9, 2015, under 35 U.S.C. 119, the entire contents of which are hereby incorporated by reference.

BACKGROUND

1. Field of the Invention

The present invention relates to a semiconductor transistor, and more particularly to a high-hole-mobility transistor (HHMT) having a high-hole-mobility germanium channel structure on a silicon nanowire and fabrication method thereof.

2. Description of the Related Art

Throughout the history of semiconductor transistor development, a large number of high-electron-mobility transistors (HEMTs) using high-electron-mobility have been studied actively, but only a few high-hole-mobility transistors (HHMTs) with high-hole-mobility are studied.

This is because a large number of semiconductor materials having high-electron-mobility are present, but the semiconductor materials having high-hole-mobility are extremely rare.

Germanium has recently been studied for implementing germanium-based p-type metal-oxide-semiconductor field effect transistors (MOSFETs) due to its intrinsically high hole-mobility. However, there has been a limitation of techniques for getting enough high-hole-mobility of germanium because of a complexity of the manufacturing processing and a limitation of gate controllability.

For example, Korean Patent No. 10-0585111 discloses a technique for forming a channel region of germanium or silicon-germanium on three surfaces of a silicon body formed by patterning a silicon layer of a silicon-on-insulator (SOI) substrate. However, there are some problems related to this technique. Because the silicon body is formed by patterning the SOI substrate, the minimization of the silicon body is difficult. And because the gate is wrapped around the patterned SOI substrate on a gate insulating film additionally formed on the channel region, the gate controllability is reduced. Especially, because the gate insulating film such as a silicon oxide film, etc. is additionally formed on the channel region by a method such as a chemical vapor deposition (CVD) or an atomic layer deposition (ALD), it is difficult to get enough high-hole-mobility of a germanium channel by a carrier scattering at the interface between the gate insulating film and the germanium channel.

To solve the latter problem in the above patent, the present inventor has developed a technique disclosed in Korean Patent No. 10-1515071. In this technique, a gate insulating film is formed of a semiconductor material (e.g., $Al_xGa_{1-x}As$) having a predetermined valence band offset or more than germanium instead of the conventional oxide film.

But, Korean Patent No. 10-1515071 remains unsolved problems such as an additional formation of a semiconductor material for a role of the gate insulating film and a reduction of a gate controllability to the channel region due to the gate formed on the top of it.

SUMMARY

The present invention is contrived to overcome the mentioned problems. And the objective of the present invention is to provide a transistor having a germanium channel on a silicon nanowire and a fabrication method thereof. A transistor according to the present invention comprises a silicon nanowire as a core region serially wrapped by a germanium channel, a gate insulating film and a gate. Thus, the present invention enables to collect and confine holes as a carrier of HHMT in a well between the silicon core region and the gate insulating film, to gain maximum gate controllability to the germanium channel, and to simplify a fabricating process by simultaneously forming the germanium channel and the gate insulating film in one process.

To achieve the objective, a transistor according to the present invention comprises: a silicon nanowire; an active region wrapped around the silicon nanowire; a gate insulating film wrapped around the active region; and a gate wrapped around the gate insulating film, wherein the active region is formed of germanium and/or silicon germanium and the gate insulating film is a silicon oxide film.

Source and drain electrodes may be separately wrapped around the active region at both sides of the gate. Source and drain regions may be formed in the active region wrapped by the source and drain electrodes, respectively. A body or channel region may be formed in the other region of the active region except the source/drain regions. In this case, the source and drain regions may be doped with a p-type impurity having a concentration of $10^{16}\sim10^{20}/cm^3$ and the channel region may be undoped or doped with an n-type impurity having a concentration of $10^{18}/cm^3$ or lower.

The source and drain electrodes may be formed just at both ends of the active region or be formed on source and drain regions, respectively. In this case also, the source and drain regions may be doped with a p-type impurity having a concentration of $10^{16}\sim10^{20}/cm^3$ and the other region of the active region except the source/drain regions may be undoped or doped with an n-type impurity having a concentration of $10^{18}/cm^3$ or lower.

The active region, the gate insulating film and the gate may be coaxially and cylindrically wrapped around the silicon nanowire, respectively.

The active region may be formed of germanium or silicon germanium ($Si_{1-x}Ge_x$, $x \geq 0.2$) with a thickness of 1~5 nm.

The active region may comprise a silicon germanium layer wrapped around the silicon nanowire and a germanium layer wrapped around the silicon germanium layer. In this case, the thickness of the germanium layer may be 1~5 nm.

A method for fabricating a transistor according to the present invention comprises: a first step of preparing a silicon nanowire; a second step of forming a silicon germanium layer wrapped around the silicon nanowire; a third step of simultaneously forming an active region having a high content of germanium and a silicon oxide film by an oxidation process which selectively oxidizes only silicon in the silicon germanium layer; and a fourth step of forming a gate wrapped around the silicon oxide film.

The active region may be formed of a germanium layer condensed by the oxidation process.

The third step may further comprise a process forming a gate insulating film by etching the silicon oxide film.

The third step may further comprise a process forming source and drain contact regions on the germanium layer exposed by etching the silicon oxide film at both sides of the silicon nanowire and the fourth step may simultaneously form source and drain electrodes on the source and drain contact regions together with the gate.

The fourth step may simultaneously form source and drain electrodes at both side-ends of the germanium layer together with the gate.

The fourth step may further process an ion implantation process to form source and drain regions at both ends of the active region after forming the gate.

The active region, the silicon oxide film and the gate may be coaxially and cylindrically wrapped around, respectively.

By a silicon nanowire as a core region being serially wrapped by a germanium channel, a gate insulating film and a gate, the present invention enables to form a potential well for storing holes as a carrier of HHMT in the germanium channel by a valance band energy offset between the silicon core region and the germanium channel, to gain maximum gate controllability to the germanium channel, and to simplify a fabricating process by simultaneously forming the germanium channel and the gate insulating film in one process.

BRIEF DESCRIPTION OF THE DRAWINGS

FIGS. 7A to 7C show an energy band diagram (FIG. 7B) and a hole-current-density diagram (FIG. 7C) in a cross-sectional view (FIG. 7A) of FIG. 3, respectively, when turning-on a transistor of FIG. 1 by applying a negative voltage to a gate.

Figure 1:
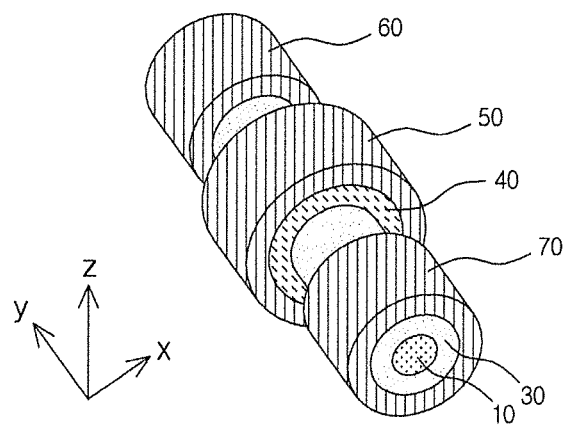
FIG. 1 is a perspective view of a transistor structure according to an embodiment of the present invention.
Figure 2:
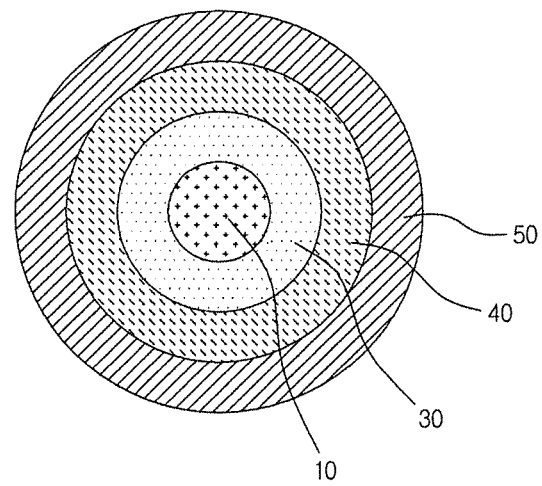
FIG. 2 is a cross-sectional view taken along the x-direction in the gate of FIG. 1.

In these drawings, the following reference numbers are used throughout: reference number 10 indicates a silicon nanowire, 20 a silicon germanium layer, 30 and 30' an active region or a germanium layer, 40 a silicon oxide film, 42 a gate insulating film or a silicon oxide film, 44 a trench, 50 a gate, 60 a source electrode, 62 a source region, 70 a drain electrode and 72 a drain region.

DETAILED DESCRIPTION

Detailed descriptions of preferred embodiments of the present invention are provided below with reference to accompanying drawings.

A transistor according to the present invention, as commonly shown in FIGS. 1 to 6, 14 and 16, comprises: a silicon nanowire 10; an active region 30 and 30' wrapped around the silicon nanowire; a gate insulating film 40 wrapped around the active region; and a gate 50 wrapped around the gate insulating film, wherein the active region 30 and 30' is formed of germanium and/or silicon germanium and the gate insulating film 40 is a silicon oxide film.

Here, the silicon nanowire 10 can be a silicon rod in a form of a circular column with a diameter of several tens nm or less, the cross-sectional shape of the silicon nanowire 10 can be a circle, an oval, or a polygon like a quadrangle but not limited to. The silicon nanowire 10 can be fabricated by the techniques described in Korean Patent No. 10-0904588, etc.

Figure 3:
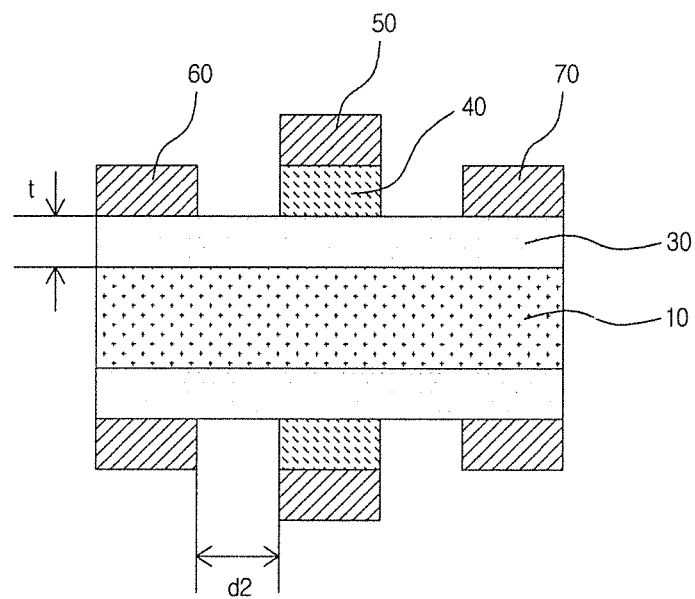
FIG. 3 is a cross-sectional view taken along the y-direction in the gate of FIG. 1.
Figure 4:
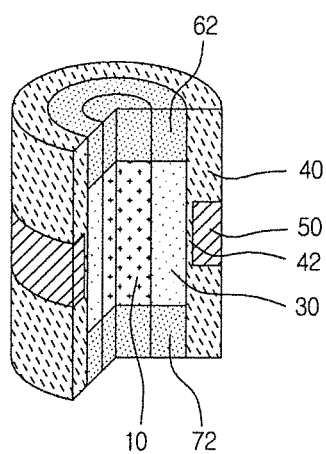
FIG. 4 is a quarter cross-sectional and perspective view of a transistor structure according to another embodiment of the present invention.

The active region 30 and 30' may comprise a channel region forming a channel between source/drain electrodes 60 and 70 and further comprise regions being directly contacted by source/drain electrodes 60 and 70 as shown in FIGS. 1 and 3 or source/drain regions 62 and 72 doped with an impurity to have a high concentration as shown in FIG. 4.

As described above, because the active region 30 and 30' is a region used directly to operate a transistor, for the objective of the present invention, the active region 30 and 30' is formed to be wrapped around the silicon nanowire 10 with germanium and/or silicon germanium.

Figure 16:
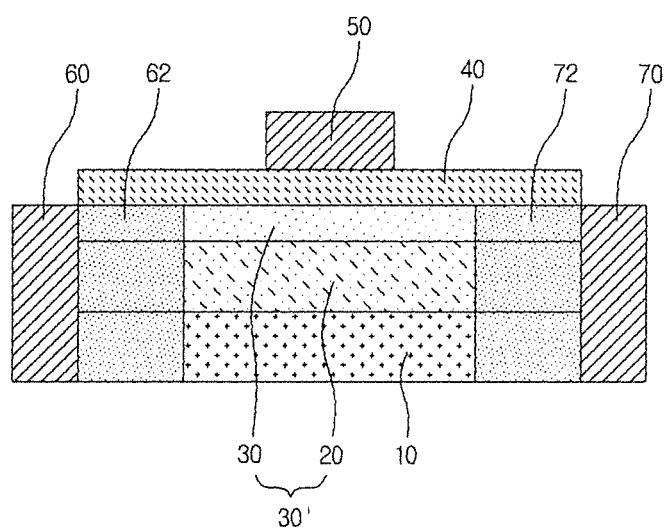

According to the detailed embodiment, the active region 30 and 30' can be a single semiconductor layer 30 formed of germanium or silicon germanium as shown in FIGS. 1 to 6 and 14 or can consist of a silicon germanium layer 20 wrapped around the silicon nanowire 10 and a germanium layer 30 wrapped around the silicon germanium layer 20 as shown in FIG. 16.

In the former embodiment, it is preferable that the single germanium layer 30 is wrapped around the silicon nanowire 10 of the inside core region in order that a valance band offset ($\Delta$Ev) between the germanium layer 30 as an active region and the silicon nanowire 10 is greatly increased as shown in FIG. 7B.

The energy bandgaps of germanium and silicon are 0.66 eV and 1.12 eV, respectively. Because the electron affinities of germanium and silicon are similar to each other, the energy bandgap difference between germanium and silicon is almost reflected in the valance band offset.

Accordingly, as shown in FIG. 7A, when the germanium layer 30 as the active region is wrapped around the silicon nanowire 10, the active region 30 can be formed of a ring-shaped potential well between the silicon nanowire 10 and the silicon oxide film 40 as shown in FIG. 7B and when turning-on the gate by applying a negative voltage, the holes can be collected and confined in the ring-shaped potential well as shown in FIG. 7C. Thus, nanowire transistor can be operated by high hole mobility.

In the described above, the active region 30 and 30', the gate insulating film 40 and the gate 50 can cover a part of each lower component, respectively, though it is not shown in the accompanying drawings. But it is preferable that the active region 30 and 30', the gate insulating film 40 and the gate 50 are formed to fully cover each lower component as shown in FIGS. 1 to 6, 14 and 16 in order to gain maximum gate controllability to the germanium channel.

Figure 8:
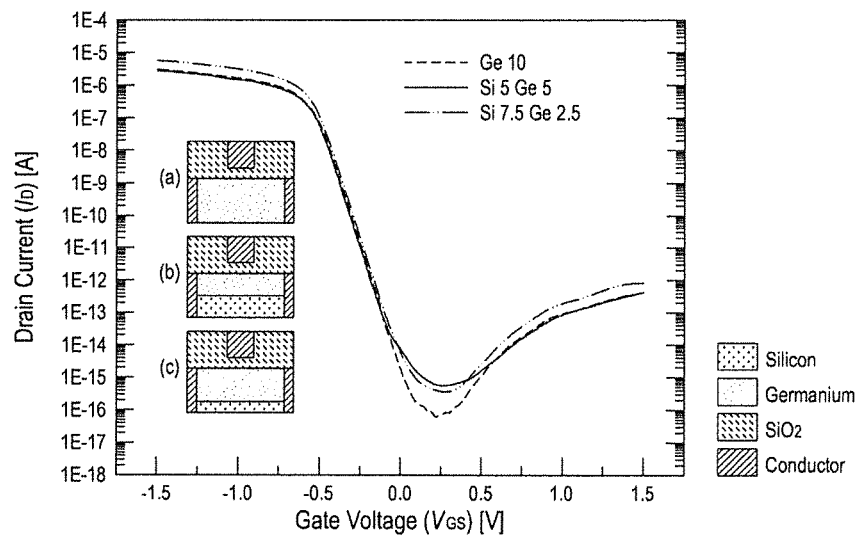
FIG. 8 is an electrical characteristic view showing comparison of drain current (b) vs. gate voltage (VGs), when changing a radius of a silicon nanowire and a thickness of a germanium layer in a transistor structure according to an embodiment of FIG. 4.

FIG. 8 is an electrical characteristic view showing comparison of drain current (b) vs. gate voltage (VGs) when changing a radius of a silicon nanowire 10 and a thickness of a germanium layer 30 in a transistor structure according to an embodiment of FIG. 4.

According to FIG. 8, it is shown that the structure of FIGS. 8B and 8C having a silicon nanowire 10 as a core region wrapped by a germanium layer 30 with a predetermined thickness (t) can raise a current drivability more than the structure of FIG. 8A formed of only a germanium layer without the core region of the silicon nanowire 10. As described above, because the ring-shaped potential well can be formed in the germanium layer 30 wrapped around the core region of the silicon nanowire 10 between the silicon nanowire 10 and the silicon oxide film 40 and holes can be collected in the well, it is analyzed that the hole mobility is increased.

Figure 9:
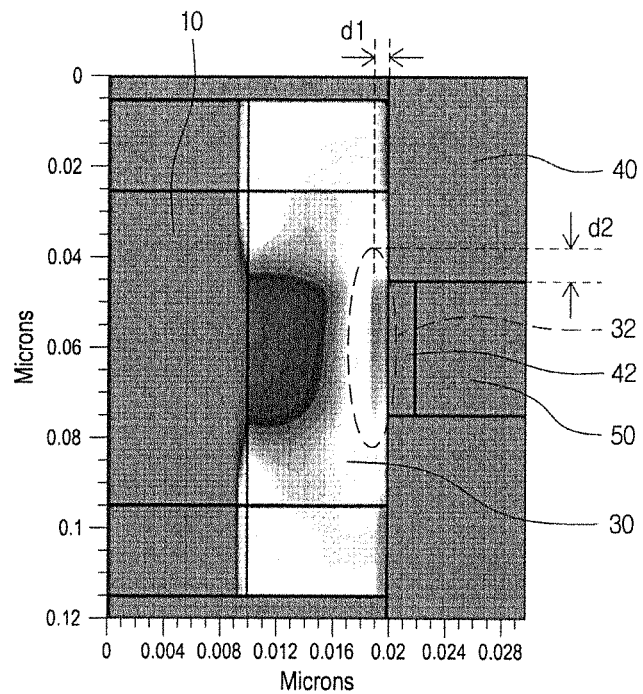
FIG. 9 is a simulation result view for measuring a hole concentration in a germanium layer, when a radius of a silicon nanowire and a thickness of a germanium layer are 10 nm, respectively and a negative voltage is applied to a gate.

FIG. 9 is a simulation result view for measuring a hole concentration in a germanium layer, when a radius of a silicon nanowire 10 and a thickness (t) of a germanium layer 30 are 10 nm, respectively and a negative voltage is applied to a gate.

According to FIG. 9, it is known that the concentration of holes as a large number of carriers is maximized at a place (d1) with a distance of about 1 nm from the interface between a silicon oxide film 42 as a gate insulating film and a germanium layer 30. This is caused by a quantum-mechanical effect in the potential well formed in the germanium layer 30 wrapped around the silicon nanowire 10. Thus, the present invention use it to increase a hole mobility for driving SIT.

When holes are accumulated in the potential well, a channel is formed in the germanium layer 30 under the silicon oxide film 42. The channel 32, as shown in FIG. 9, is formed to be expanded to a predetermined length (d2) from both sides of the gate 50.

Thus, source and drain electrodes 60 and 70 of a transistor according to the present invention, as shown in FIGS. 1 and 3, can be just wrapped around an active region 30 at both sides of a gate 50. In this case, it can be formed at a distance (d2) of 5~10 nm from both sides of the gate 50.

But, more preferably, though it is not shown in drawings, source and drain regions are formed in the portions of the active region wrapped by source and drain electrodes 60 and 70 and a body or channel region can be formed in the other region of the active region except the source/drain regions.

And because a transistor according to the present invention can have a germanium based pMOSFET structure, the active region can comprise a source region, a channel region and a drain region doped with P+/N/P+, respectively. At this time, preferably, the source and drain regions are doped with a p-type impurity and have a concentration of $10^{16}$~10/cm$^3$ and the channel region is undoped or doped with an n-type impurity and has a concentration of $10^{18}$/cm$^3$ or lower. If the impurity concentrations of the source and drain regions are much lower than the range, ON/OFF ratio is dropped down due to the very low level of driving current. If the concentration is higher than the range, a leakage current is increased at a turn-off state (i.e., when a positive voltage is applied to the gate). If the impurity concentration of the channel region is over $10^{18}$/cm$^3$, the leakage current can be increased in the junctions with source and drain regions.

Figure 6:
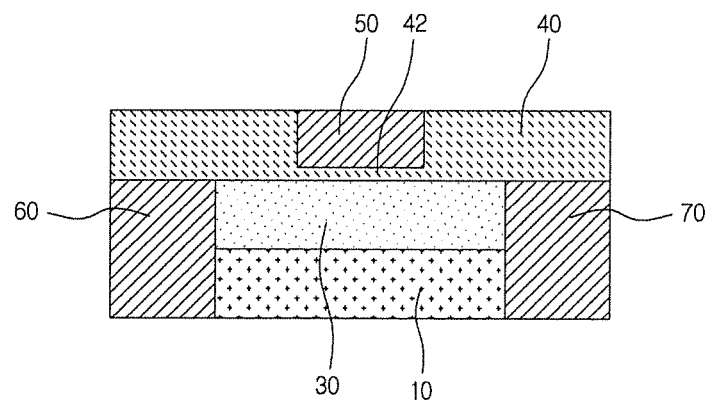
FIG. 6 is a partial cross-sectional view of a transistor structure according to another embodiment of the present invention.

In another embodiment, as shown in FIG. 6, the source and drain electrodes 60 and 70 can be formed just at both ends of the active region 30.

In other embodiments, as shown in FIGS. 4, 5, 14 and 16, the source and drain regions 62 and 72 can be firstly formed at both ends of the active region 30 and then the source and drain electrodes 60 and 70 can be formed on the source and drain regions, respectively. In this case, for the same reason as in the above embodiment, it is preferable that the source and drain regions are doped with a p-type impurity having a concentration of $10^{16}$~$10^{20}$/cm$^3$ and the channel region is undoped or doped with an n-type impurity having a concentration of $10^{18}$/cm$^3$ or lower.

From the simulation result shown in FIG. 9, in each of the embodiments, the active region 30 and 30' is preferably formed of germanium or silicon germanium ($Si_{1-x}Ge_x$, x≥0.2) with a thickness (t) of 1~5 nm. In the latter, if the content of germanium is 20% or less, it is difficult to achieve the objective of the present invention, namely, it has difficulties in forming the potential well and catching efficiently holes by the well.

In another embodiment, as an embodiment shown in FIG. 16, the active region 30' can comprise a silicon germanium layer 20 wrapped around the silicon nanowire 10 and a germanium layer 30 wrapped around the silicon germanium layer 20. In this case, the thickness of the germanium layer 30 is preferably 1~5 nm.

In the above described embodiments, the thickness of the active region formed of germanium or silicon germanium or the thickness of the germanium layer 30 can be limited to 1~5 nm. If the thickness is 1 nm or less, it is advantageous to raise a controllability of the gate 50 and to suppress a short channel effect, but it has a problem that reduces the total amount of current. If the thickness is over 5 nm, it has a problem that reverses the miniaturization of device because the active region 30 and 30' is unnecessarily enlarged in a state that already obtains enough high-current level of a turn-on state.

Next, detailed descriptions of a fabrication method of a transistor according to the present invention are provided with reference to FIGS. 10 to 16. Here, FIGS. 10 to 16 are partial cross-sectional views showing a view when a quarter is sectioned as shown in FIG. 4. Accordingly, a whole solid structure can be obtained when the lower end line of each drawing is used as its axis and is rotated by 360 degree.

Figure 10:
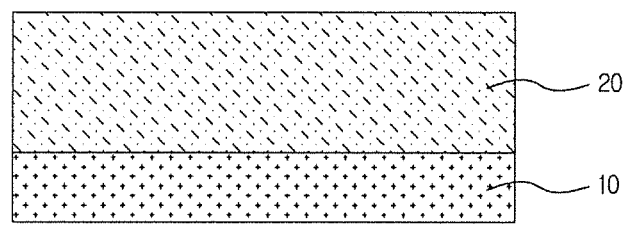
FIGS. 10 to 14 are fabricating process diagrams showing a fabrication method for a transistor according to an embodiment of FIG. 4.

First, as shown in FIG. 10, a silicon nanowire 10 may be prepared in a first step and a silicon germanium layer 20 may be wrapped around the silicon nanowire 10 in a second step. Here, the silicon nanowire 10 can be fabricated by the above Korean Patent No. 10-0904588, etc. and the fabrication of the silicon germanium layer 20 can be formed by the known epitaxial crystalline growth or deposition process.

Figure 11:
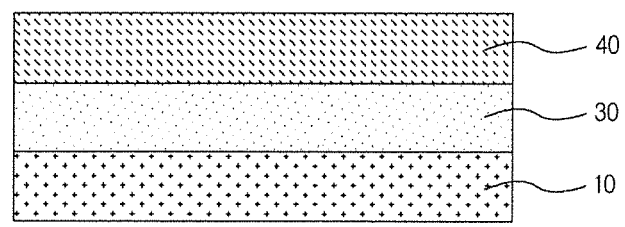
Figure 15:
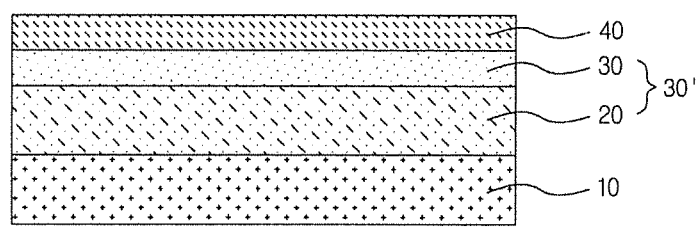
FIGS. 15 and 16 are fabricating process diagrams showing a fabrication method for a transistor according to another embodiment of the present invention.

Next, as shown in FIG. 11, a silicon oxide film 40 can be formed by bonding oxygen to silicon of the silicon germanium layer through an oxidation process for oxidizing the silicon germanium layer 20 and, at the same time, an active region 30 can be formed by condensing germanium into the empty sites of silicon in the silicon germanium layer in a third step. Here, by controlling the conditions of the oxidation process, as shown in FIG. 15, the lower portion of the silicon germanium layer 20 can be maintained as silicon germanium and a germanium layer 30 and a silicon oxide film 40 can be formed in the upper portion only. Especially, it is preferable that the active region 30 is formed of a 100% or near 100% condensed germanium layer by the oxidation process.

Figure 12:
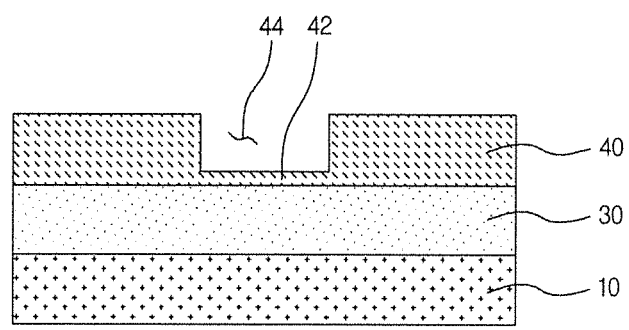
Figure 13:
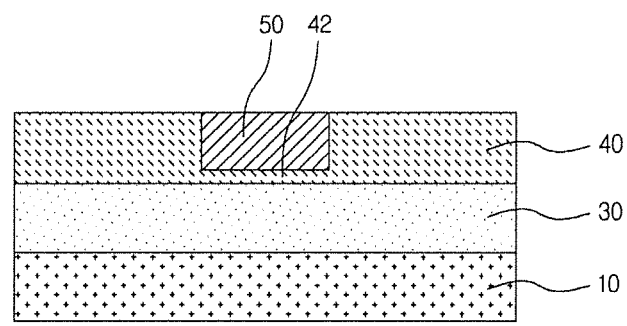

Next, a gate 50 may be wrapped around the silicon oxide film 40 in a fourth step. At this time, the gate 50, as shown in FIGS. 3 and 16, can be just wrapped around the silicon oxide film 40 or, as shown in FIG. 12, after forming a trench 44 and a thin gate insulating film 42, the gate 50 can be formed by filling the trench 44 with a conductive material as shown in FIG. 13.

Before forming the gate 50 in the fourth step, in order to fabricate the transistor shown in FIG. 1, a process for forming source and drain contact regions (not shown) on the germanium layer 30 exposed by etching the silicon oxide film 40 at both sides of the silicon nanowire 10 can be further processed. And then source and drain electrodes 60 and 70 can be simultaneously formed on the source and drain contact regions together with the gate 50 in the fourth step.

In another embodiment forming the source and drain electrodes 60 and 70, in order to form the transistor shown in FIG. 6, the source and drain electrodes 60 and 70 can be simultaneously formed at both ends of the germanium layer 30 together with the gate 50 in the fourth step.

Figure 5:
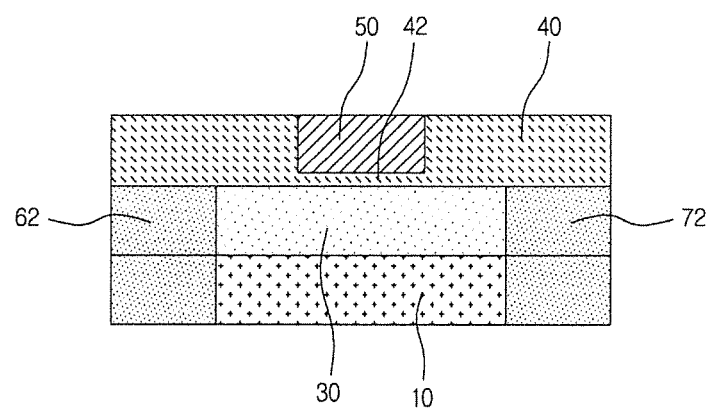
FIG. 5 is a partial cross-sectional view shown in FIG. 4.
Figure 14:
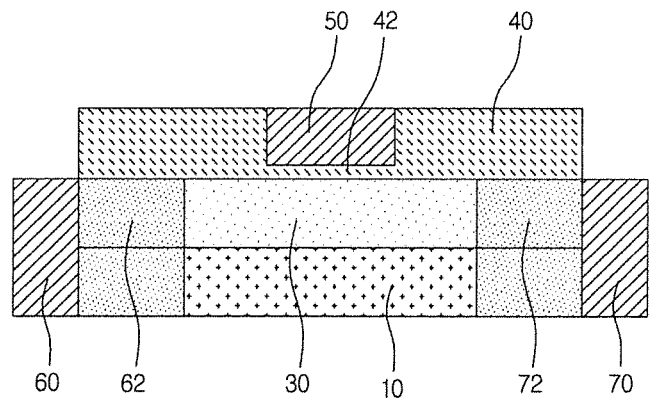

In another embodiment forming the source and drain electrodes 60 and 70, in order to form the transistor shown in FIG. 14, after forming the gate 50, the fourth step can further process an ion implantation process, as shown in FIGS. 5, 14 and 16, to form source and drain regions 62 and 72 at both ends of the active region 30 and 30' and to form source and drain electrodes 60 and 70 on the source and drain regions 62 and 72, respectively.

In each embodiment described above, the active region 30 and 30', the silicon oxide film 42 and the gate 50 can be formed to be coaxially and cylindrically wrapped around the silicon nanowire 10 as a core region, respectively.

This work was supported by the National Research Foundation of Korea (NRF) funded by Ministry of Science, ICT & Future Planning (NRF-2014R1A1A1003644).

What is claimed is:

1. A transistor comprising:
a silicon nanowire;
an active region wrapped around the silicon nanowire;
a gate insulating film wrapped around the active region; and
a gate wrapped around the gate insulating film, wherein
the active region is formed of germanium and/or silicon germanium and the gate insulating film is a silicon oxide film,
the active region, the gate insulating film and the gate are coaxially and cylindrically wrapped around the silicon nanowire, respectively, and
the active region is formed of germanium or silicon germanium (Si1-xGex, x≥0.2) with a thickness of 1~5 nm.

2. The transistor of claim 1, wherein the active region comprises a silicon germanium layer wrapped around the silicon nanowire and a germanium layer wrapped around the silicon germanium layer.

3. The transistor of claim 2, wherein a thickness of the germanium layer is 1~5 nm.

4. A transistor comprising:
a silicon nanowire;
an active region wrapped around the silicon nanowire;
a gate insulating film wrapped around the active region; and
a gate wrapped around the gate insulating film, wherein
the active region is formed of germanium and/or silicon germanium and the gate insulating film is a silicon oxide film,
source and drain electrodes are separately wrapped around the active region at both sides of the gate,
the active region, the gate insulating film and the gate are coaxially and cylindrically wrapped around the silicon nanowire, respectively, and
the active region comprises a silicon germanium layer wrapped around the silicon nanowire and a germanium layer wrapped around the silicon germanium layer.

5. A transistor comprising:
a silicon nanowire;
an active region wrapped around the silicon nanowire;
a gate insulating film wrapped around the active region; and
a gate wrapped around the gate insulating film, wherein
the active region is formed of germanium and/or silicon germanium and the gate insulating film is a silicon oxide film,
source and drain regions are formed in the active region wrapped by the source and drain electrodes, respectively,
a body or channel region is formed in the other region of the active region except the source/drain regions,
the active region, the gate insulating film and the gate are coaxially and cylindrically wrapped around the silicon nanowire, respectively, and
the active region comprises a silicon germanium layer wrapped around the silicon nanowire and a germanium layer wrapped around the silicon germanium layer.

6. A transistor comprising:
a silicon nanowire;
an active region wrapped around the silicon nanowire;
a gate insulating film wrapped around the active region; and
a gate wrapped around the gate insulating film, wherein
the active region is formed of germanium and/or silicon germanium and the gate insulating film is a silicon oxide film,
source and drain electrodes are separately formed at both ends of the active region,
the active region, the gate insulating film and the gate are coaxially and cylindrically wrapped around the silicon nanowire, respectively, and
the active region comprises a silicon germanium layer wrapped around the silicon nanowire and a germanium layer wrapped around the silicon germanium layer.

7. A transistor comprising:
a silicon nanowire;
an active region wrapped around the silicon nanowire;
a gate insulating film wrapped around the active region; and
a gate wrapped around the gate insulating film, wherein
the active region is formed of germanium and/or silicon germanium and the gate insulating film is a silicon oxide film,
source and drain electrodes are separately formed at both ends of the active region,
source and drain regions are separately formed at both ends of the active region and the source and drain electrodes are formed on the source and drain regions, respectively,
the active region, the gate insulating film and the gate are coaxially and cylindrically wrapped around the silicon nanowire, respectively, and
the active region comprises a silicon germanium layer wrapped around the silicon nanowire and a germanium layer wrapped around the silicon germanium layer.

8. The transistor of claim 7, wherein a thickness of the germanium layer is 1~5 nm.

* * * * *